United States Patent [19]

Morse et al.

[11] Patent Number: 5,726,605
[45] Date of Patent: Mar. 10, 1998

[54] SILICON CARBIDE RF POWER MODULE

[75] Inventors: Alfred W. Morse, Ellicott City; Paul M. Esker; Robin E. Hamilton, both of Millersville, all of Md.

[73] Assignee: Northrop Grumman Corporation, Los Angeles, Calif.

[21] Appl. No.: 626,899

[22] Filed: Apr. 14, 1996

[51] Int. Cl.$^6$ .................................. H03F 3/68; H03F 1/30
[52] U.S. Cl. .................... 330/295; 330/65; 330/286; 330/289; 330/307
[58] Field of Search ........................... 330/65, 286, 289, 330/295, 307

[56] References Cited

U.S. PATENT DOCUMENTS

| | | | |
|---|---|---|---|
| 5,208,554 | 5/1993 | Endler et al. | 330/295 |
| 5,264,713 | 11/1993 | Palmour | 257/77 |
| 5,352,991 | 10/1994 | Lipschultz | 330/65 X |
| 5,396,403 | 3/1995 | Patel . | |

FOREIGN PATENT DOCUMENTS

| | | | |
|---|---|---|---|
| 0434264 | 6/1991 | European Pat. Off. . | |
| 27520 | 3/1981 | Japan | 330/295 |

OTHER PUBLICATIONS

IEEE MTT-S International Microwave Symposium Digest, San Diego, May 23-27, 1994, vol. 1, 23 May 1994, Kuno, H.J.; Wen, C.P., "A 4 to 25 GHz 0.5W Monolithic Lossy Match Amplifier", pp. 257-260.

*Primary Examiner*—James B. Mullins
*Attorney, Agent, or Firm*—Walter C. Sutcliff

[57] ABSTRACT

An RF power amplifier module utilizing a plurality of silicon carbide transistor power amplifier circuits, each including a transistor assembly having multiple cells, respectively providing power amplification of an input signal. In a preferred embodiment of the invention, four mutually staggered silicon carbide transistor assemblies, each containing multiple transistor cells, are operated in parallel while being arranged in close proximity on a common substrate. Each silicon carbide amplifier circuit assembly is commonly driven by a fifth silicon carbide amplifier circuit. The outputs of the parallely driven silicon carbide transistor power amplifier circuits are combined so as to provide a single composite RF output signal which may be in the order of 1000 watts or more when operated at a frequency of, for example, 600 MHz.

17 Claims, 2 Drawing Sheets

SILICON CARBIDE RF POWER MODULE

BACKGROUND OF THE INVENTION

1. Field of the Invention

This invention relates generally to electrical signal power amplifiers and more particularly to an RF power module utilizing silicon carbide transistors.

2. Description of the Prior Art

Solid state devices used for amplifying electrical signals are generally well known and typically involve such devices as the transistor. As the state of the art of semiconductor technology advances and more particularly to those types of devices which are known as power semiconductor devices and the circuitry associated therewith, there is a continued demand that such devices operate faster and handle more power, while being even smaller and lower in cost. The semiconductor industry has responded with the development of bipolar transistors fabricated in silicon and which are currently being incorporated in densely packaged structures that can handle kilowatts of power. The extent to which this type of device can be used, for example, in high power RF amplification lies in the ability to operate at relatively high operating temperatures. Current state of the art electronic packaging techniques typically use redundant parts and excess substrate boundary regions as well as operating the electronics at less than their rated values. For example, in transmitters, silicon RF transistors are typically operated below their rated power output capability and are spaced apart from one another by relatively large separation distances in order to keep them cooled to standardized operating temperatures.

SUMMARY

Accordingly, it is an object of the present invention to provide an improvement in electrical signal amplifiers.

It is another object of the invention to provide improvement in RF power amplifiers.

It is a further object of the invention to provide an improvement in solid state RF power amplifier modules.

And it is still a further object of the invention to provide an improvement in solid state RF power amplifier modules which are adapted to withstand higher operating temperatures while providing higher power density and can operate at relatively higher operating voltages.

Briefly, the foregoing and other objects are achieved by an RF power amplifier module utilizing a plurality of RF power transistors fabricated in silicon carbide, with each transistor containing multiple cells, respectively capable of providing many times the power of prior art devices fabricated in silicon. In a preferred embodiment of the invention, four power amplifier circuits each including a silicon carbide transistor assembly, containing multiple transistor cells, are arranged in relatively close proximity to one another and operated in parallel on a common substrate and being driven by a fifth amplifier circuit also including a silicon carbide transistor assembly. The outputs of the parallely driven silicon carbide transistor assemblies are combined so as to provide a single composite RF output signal which may be in the order of 1000 watts or more when operated at a frequency of, for example, 600 MHz.

Further scope of applicability of the present invention will become apparent from the detailed description given hereinafter. However, it should be understood that the detailed description and specific example, while indicating the preferred embodiment of the invention, is given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description and given hereinbelow in the accompanying drawings which are given by way of illustration only, and thus are not limitative of the present invention, and wherein.

DETAILED DESCRIPTION OF THE PREFERRED EMBODIMENT

Consideration of the preferred embodiment is prefaced by the following. Solid state modules are the next higher level above that of a simple RF transistor. The function of a module is to combine the transistor with proper impedance matching, filtering, bias voltages, cooling and mechanical protection in the same package. Modules typically combine more than one transistor in order to realize increased gain and power output potential.

The module's characteristics are crucial to the performance of the system in which it is used. It is the module that largely determines the system complexity, size, weight, spectral characteristics, stability, bandwidth and efficiency. Therefore, desirable RF module characteristics of this invention include: (1) High power density, which is the power developed in a given size and weight and largely determines the size and weight of the apparatus with which it is used, typically a transmitter; (2) wide bandwidth, which is determined by the transistor itself as well as the circuitry required to combine and match the transistor to the impedance of external apparatus, typically 50 Ohms; (3) relatively high power supply voltages and low currents which result in greater efficiency than lower voltage models of the same power; and (4) operating temperatures which are relatively high thus requiring waste heat dissipation to the outside environment. Heat dissipation is most efficiently handled when a high temperature differential is allowable to the ambient cooling medium. A high tolerance to temperature rise can allow a module to utilize air cooling instead of liquid cooling, which is in some instances, less desirable. Accordingly, transistors are usually the limiting component in module tolerance to temperature.

Figure 1:
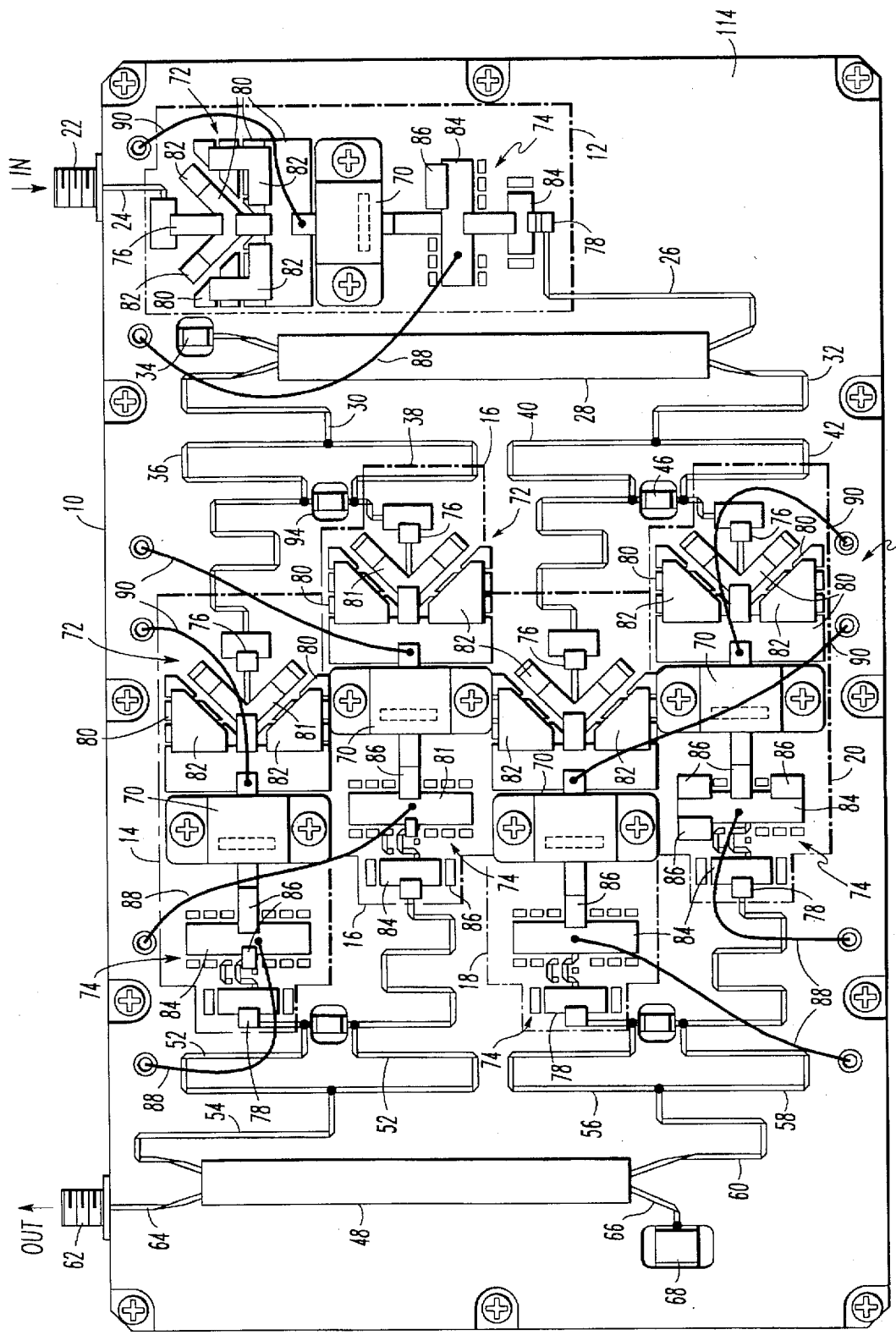
FIG. 1 is a top plan elevational view of the preferred embodiment of the subject invention.
Figure 2:
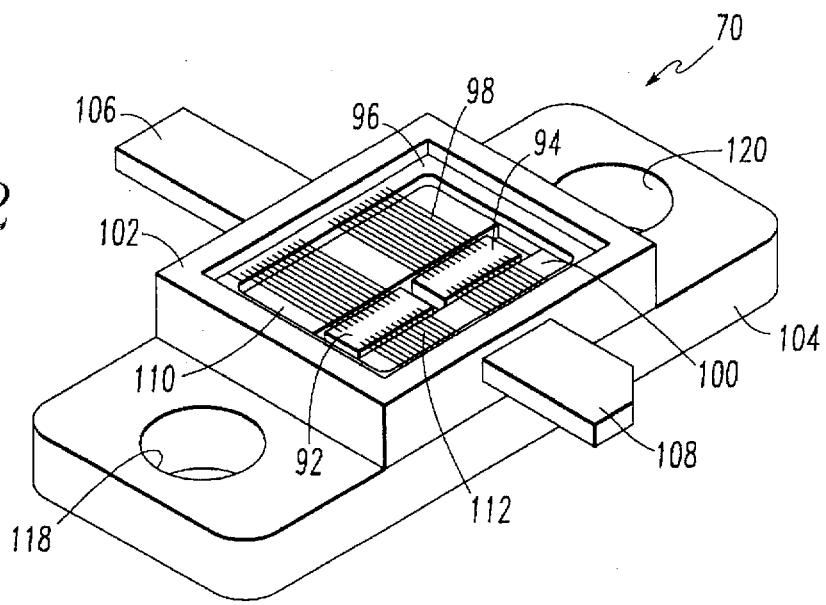
FIG. 2 is a perspective view illustrative of one of the silicon carbide transistor assemblies utilized in the embodiment shown in FIG. 1.
Figure 3:
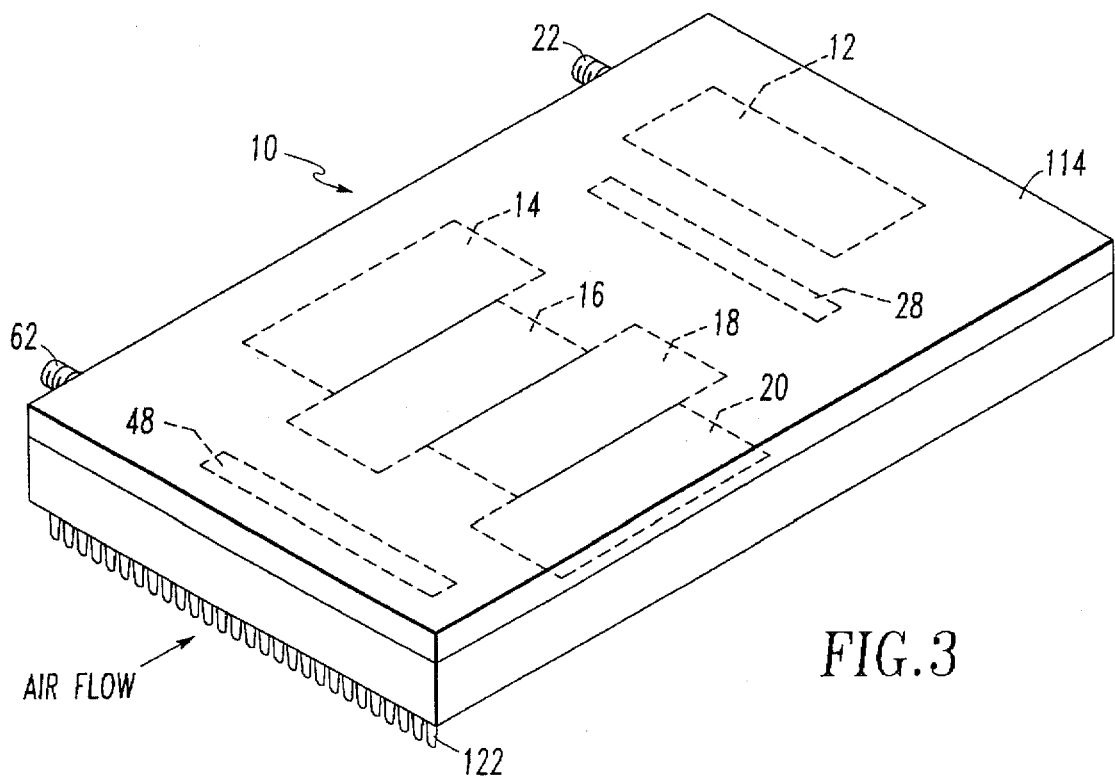
FIG. 3 is a perspective view generally illustrative of the substrate and cooling technique utilized with the embodiment shown in FIG. 1.

Referring now collectively to FIGS. 1-3 wherein like reference numerals refer to like components, the preferred embodiment of this invention as shown in FIG. 1 comprises an RF power amplifier module 10 which includes, inter alia, a driver stage 12 and four relatively closely spaced and mutually staggered parallel power amplifier stages 14, 16, 18 and 20 commonly driven by the driver stage 12.

Further as shown in FIG. 1, a coaxial input connector 22 couples an RF input signal, e.g. a 600 MHz signal, to the input side of the driver stage 12 by means of a stripline conductor 24. The driver stage 12 provides a boost in gain to the input signal. The output of the driver stage 12 is coupled via stripline conductor 26 to a well known signal splitter device 28 which separates the signal into two intermediate signals which are coupled to stripline conductors 30 and 32. A circuit termination 34 is coupled to the remaining lead of the signal splitter 28.

The two signals appearing on stripline conductors 30 and 32 are next applied to silicon carbide transistor assemblies located in amplifier stages 14, 16, 18 and 20 by way of stripline conductors 36, 38, 40 and 42. Conductors 36 and 38 include a balance resistor 44 therebetween. Conductors 40 and 42 likewise include a balance resistor 46.

The outputs of the four amplifier stages 14, 16, 18 and 20, are combined by a signal combiner device 48 which is identical in structure to the signal splitter 28 but is now operated in reverse. More particularly, the outputs of amplifier stages 14 and 16 are fed to one side of the signal combiner 48 by means of stripline conductors 50, 52 and 54, while the outputs of amplifier stages 18 and 20 are coupled to the other side of the signal combiner 48 by means of stripline conductors 56, 58 and 60. The combined output from the signal combiner 48 is fed to a coaxial connector 62 by means of stripline conductor 64. The remaining signal lead 66 from the signal combiner is coupled to a termination member 68.

All five stages 12, 14, 16, 18 and 20 include common circuit elements, namely each includes a silicon carbide transistor assembly 70, the details of which are shown in FIG. 2, input and output stripline type impedance transformation sections 72 and 74 and input and output coupling capacitors 76 and 78, respectively.

The impedance transformation sections 72 and 74 are required because power transistors, particularly silicon transistors, to be described hereinafter and included in the transistor assemblies 70, have an impedance which are much lower than the impedance external to the module, which is typically 50 Ohms. Thus impedance matching is required for wide bandwidth operation.

Each input impedance transformation section 72 includes a plurality of stripline pads 80 selectively covered by stripline elements 82 which operate to reduce the input impedance to match the input impedance of the silicon carbide transistor assembly 70 to which it is coupled. The output impedance transformation sections 74 are also comprised of a plurality of stripline pads 84 which are selectively covered by stripline overlay members 86 and operate to match the output impedance of silicon carbide transistor assemblies to the impedance of the output circuitry.

Further as shown in FIG. 1, pairs of power supply leads 88 and 90 couple a relatively higher power supply voltage across the silicon carbide transistor assemblies 70 because silicon carbide transistors operate at a drain power supply voltage of, for example, 95 volts, which is considerably higher than the prior art power supply voltage of 50 volts, which are used in connection with silicon RF transistor devices.

Considering now the details of the transistor assemblies 70, one is shown in FIG. 2. Each assembly 70 is comprised of one or more silicon carbide chips or dies respectively containing a plurality of identical parallel transistor cells totaling, for example, sixty cells in number, and being fabricated in silicon carbide. Such devices can safely operate at increased temperatures relative to such devices fabricated in silicon and are thus required for the close spacing of the active components as shown in FIG. 1.

As shown in FIG. 2, two chips 92 and 94 are located on a ceramic substrate 96 between two impedance transformation sections 98 and 100. All of the elements are located within a metallized frame 102 bonded to an elongated generally rectangular metal flange member 104. The silicon carbide transistor cells in the chips 92 and 94 are coupled in parallel to a pair of flat, relatively thick input and output leads 106 and 108 by means of relatively thin wire leads 110 and 112.

As shown in FIG. 3 a generally flat planar dielectric substrate 114 is formed on a relatively thicker substrate 116 of aluminum cladding. Each silicon carbide transistor structure 70 shown in FIG. 2 is attached to the surface of the dielectric substrate 114, preferably by way of hardware screws, not shown, which pass through a pair of mounting holes 118 and 120 located at either end 104 of the flange 104 and enhance heat conduction to the substrate 116.

Although attachment by metallic hardware is preferred, when desirable, soldering may be resorted to for mounting the transistor assembly 70 on the ceramic substrate 114.

Further as shown in FIG. 3, the module 10 operates with air cooling using finstock 122 bonded to the bottom of the aluminum cladding substrate 116. Air cooling is facilitated by an increased temperature tolerance of the silicon carbide transistors as compared to silicon transistors.

Thus what has been shown and described is a new class of solid state RF power amplifier modules which combine silicon carbide semiconductor technology with new circuit techniques, packaging and cooling design and combine to achieve improved performance characteristics which include, significantly higher power density, e.g. 4:1 higher DC operating voltage and a lower current requirement, the ability to withstand higher operating temperatures, and high circuit impedances which simplify broadband device matching.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

We claim:

1. An electrical power amplifier module for operating at RF frequencies, comprising:

means for receiving an input signal;

a plurality of relatively closely spaced parallely driven electrical signal power amplifier circuits coupled to said input signal and being located on a common support structure, each of said amplifier circuits including a relatively high power silicon carbide transistor assembly attached to said support structure for generating respective amplified output signals from said input signal;

means coupled to said plurality of amplifier circuits for combining said amplified output signals and outputting a composite output signal thereby achieving a relatively high power density;

wherein said silicon carbide transistor assembly includes at least one silicon carbide die consisting of a plurality of identical transistor cells fabricated in silicon carbide and having a relatively high supply voltage applied thereto so as to operate with relatively low currents and thereby reduce distribution losses, and, wherein said silicon carbide transistor assembly is located within a respective metallized frame bonded to an elongated metal flange member attached to said support structure, said plurality of transistor cells also being supported by a ceramic substrate located within said metallized frame and being coupled in parallel by respective relatively thin wire leads located inside of said metallized frame to a pair of relatively thick input and output leads extending from said metallized frame.

2. An electrical power amplifier module in accordance with claim 1 wherein each of said power amplifier circuits include respective impedance matching means coupled to an input side and an output side of said silicon carbide transistor assembly for producing a wide bandwidth operating characteristic.

3. An electrical power amplifier module in accordance with claim 2 and wherein said impedance matching means comprise stripline impedance transformer means.

4. An electrical power amplifier module in accordance with claim 2 wherein said support structure includes a heat conducting substrate and heat dissipation means attached to said substrate for dissipating heat generated by said silicon carbide transistor assemblies to an outside environment.

5. An electrical power amplifier module in accordance with claim 4 wherein said heat dissipation means comprises air cooled heat dissipation means.

6. An electrical power amplifier module in accordance with claim 5 wherein said air cooled heat dissipation means includes a finstock structure.

7. electrical power amplifier module in accordance with claim 2 wherein said means for receiving an input signal additionally includes a driver amplifier circuit coupled to said input signal for driving said power amplifier circuits.

8. An electrical power amplifier module in accordance with claim 7 wherein said driver amplifier circuit includes a said silicon carbide transistor assembly.

9. An electrical power amplifier module in accordance with claim 8 wherein said driver amplifier circuit also includes impedance matching means coupled to an input side and an output side of said silicon carbide transistor assembly for further producing a wide bandwidth operating characteristic.

10. An electrical power amplifier module in accordance with claim 9 wherein said impedance matching means comprise stripline transformer means.

11. An electrical power amplifier module in accordance with claim 9 and additionally including signal splitter means coupled between said driver amplifier circuit and said plurality of power amplifier circuits for parallely driving said power amplifier circuits.

12. An electrical power amplifier module in accordance with claim 9 and additionally including signal combining means coupled to said plurality of power amplifier circuits for generating said composite output signal.

13. An electrical power amplifier module in accordance with claim 12 wherein said power amplifier circuits are arranged in side by side relationship intermediate said signal splitter means and said signal combining means.

14. An electrical power amplifier module in accordance with claim 13 wherein the respective silicon carbide transistor assembly of said power amplifier circuits are mutually staggered.

15. An electrical power amplifier module in accordance with claim 14 wherein each said transistor assembly includes a plurality of transistor cells.

16. An electrical power amplifier module, comprising:

input means and an output means;

signal splitter means coupled to said input means for providing a plurality of like input signals;

a plurality of relatively closely spaced parallely driven electrical signal power amplifier circuits coupled to said signal splitter means and being responsive to a respective input signal of said plurality of input signals, said power amplifier circuits being located on a common support structure, each of said amplifier circuits further including a relatively high power silicon carbide transistor assembly, wherein said silicon carbide transistor assembly includes at least one silicon carbide die consisting of a plurality of identical silicon carbide transistor cells, and being located within a respective metallized frame bonded to an elongated metal flange member attached to said support structure, said plurality of transistor cells also being supported by a ceramic substrate located within said metallized frame and being coupled in parallel by respective relatively thin wire leads located inside of said metallized frame to a pair of relatively thick input and output leads extending from said metallized frame;

signal combiner means coupled between said output means and said plurality of amplifier circuits for combining said amplified output signals and applying a composite output signal to said output means thereby achieving a relatively high power density;

means for supplying a relatively high drain power supply voltage to said silicon carbide transistor cells whereby said cells operate with relatively low currents to thereby reduce distribution losses;

respective impedance matching means coupled to an input side and an output side of said silicon carbide transistor assemblies for producing a wide bandwidth operating characteristic; and wherein said support structure includes a heat conducting substrate and heat dissipation means attached thereto for dissipating heat generated by said silicon carbide transistor cells to the outside environment.

17. An electrical power amplifier according to claim 16 and additionally including a silicon carbide transistor driver amplifier circuit, having respective impedance matching means coupled to an input side and an output side thereof, coupled between said input means and said signal splitter means.

* * * * *